(12) United States Patent
Pan et al.

(10) Patent No.: US 11,398,617 B2
(45) Date of Patent: Jul. 26, 2022

(54) PACKAGING COVER PLATE AND MANUFACTURING METHOD THEREOF, DISPLAY PANEL, AND DISPLAY DEVICE EACH HAVING PACKAGING SHEET WITH SHAPED PLURALITY CHANNELS

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Tianfeng Pan, Beijing (CN); Lihao Zhao, Beijing (CN); Biao Tian, Beijing (CN); Jianhui Zhang, Beijing (CN); Jieshu Wu, Beijing (CN); Tao Jin, Beijing (CN); Shihlun Chen, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 282 days.

(21) Appl. No.: 16/617,954

(22) PCT Filed: Jan. 10, 2019

(86) PCT No.: PCT/CN2019/071166
§ 371 (c)(1),
(2) Date: Nov. 27, 2019

(87) PCT Pub. No.: WO2020/010833
PCT Pub. Date: Jan. 16, 2020

(65) Prior Publication Data
US 2021/0367192 A1   Nov. 25, 2021

(30) Foreign Application Priority Data

Jul. 12, 2018 (CN) .......................... 201810762384.9

(51) Int. Cl.
*H01L 51/52* (2006.01)
*H01L 27/32* (2006.01)
*H01L 51/56* (2006.01)

(52) U.S. Cl.
CPC ...... *H01L 51/5246* (2013.01); *H01L 27/3244* (2013.01); *H01L 51/56* (2013.01)

(58) Field of Classification Search
CPC .. H01L 51/5246; H01L 27/3244; H01L 51/56
See application file for complete search history.

(56) References Cited

U.S. PATENT DOCUMENTS 6,628,070 B2   9/2003   Van Den Reek et al.
9,780,119 B2   10/2017  Shangguan et al.
(Continued)

FOREIGN PATENT DOCUMENTS

CN   1411615 A    4/2003
CN   2572710 Y    9/2003
(Continued)

OTHER PUBLICATIONS

First Chinese Office Action dated May 3, 2019; Appln No. 201810762384.9.

*Primary Examiner* — Michael Jung

(57) ABSTRACT

A packaging cover plate and a manufacturing method thereof, a display panel, and a display device are provided. The packaging cover plate includes: a packaging sheet including a first surface and a second surface opposite to each other. The first surface of the packaging sheet is provided with at least one first channel, the second surface of the packaging sheet is provided with at least one second channel, and an extension direction of the first channel is (Continued)

parallel to an extension direction of the second channel. An orthographic projection of the at least one first channel on the packaging sheet and an orthographic projection of the at least one second channel on the packaging sheet are arranged alternately, and a sum of a depth of the first channel and a depth of the second channel is not less than a thickness of the packaging sheet.

16 Claims, 4 Drawing Sheets

(56) References Cited

U.S. PATENT DOCUMENTS

| | | | |
|---|---|---|---|
| 10,115,929 | B2 | 10/2018 | Huang et al. |
| 2002/0101156 | A1 | 8/2002 | Park et al. |
| 2005/0023965 | A1 | 2/2005 | Maeda et al. |
| 2009/0200936 | A1 | 8/2009 | Kang et al. |
| 2014/0001450 | A1* | 1/2014 | Shinotsuka ......... H01L 51/5262 257/40 |
| 2015/0380671 | A1* | 12/2015 | Shu ..................... H01L 27/1225 257/13 |
| 2016/0372711 | A1* | 12/2016 | Song ....................... H01L 51/56 |
| 2018/0190724 | A1* | 7/2018 | Kang ..................... G06F 3/0446 |
| 2019/0384091 | A1* | 12/2019 | Li ....................... H01L 51/5281 |
| 2020/0044185 | A1 | 2/2020 | Wu et al. |

FOREIGN PATENT DOCUMENTS

| | | |
|---|---|---|
| CN | 1578554 A | 2/2005 |
| CN | 104851364 A | 8/2015 |
| CN | 105810845 A | 7/2016 |
| CN | 106601928 A | 4/2017 |
| CN | 107104201 A | 8/2017 |
| CN | 108598289 A | 9/2018 |

* cited by examiner

PACKAGING COVER PLATE AND MANUFACTURING METHOD THEREOF, DISPLAY PANEL, AND DISPLAY DEVICE EACH HAVING PACKAGING SHEET WITH SHAPED PLURALITY CHANNELS

CROSS REFERENCE TO RELATED APPLICATIONS

This application claims the priority of Chinese patent application No. 201810762384.9 entitled "Packaging Cover Plate and Manufacturing Method Thereof, Display Panel, And Display Device" filed to CNIPA on Jul. 12, 2018, the full text of which is incorporated herein by reference.

TECHNICAL FIELD

The present disclosure relates to the technical field of display, in particular to a packaging cover plate and a manufacturing method thereof, a display panel, and a display device.

BACKGROUND

Organic light-emitting diode (OLED) device, as a current-type light-emitting device, has been increasingly applied in the field of high-performance display owing to its low power consumption, self-luminescence, fast response, wide viewing angle, thinness and the ability of being used to fabricate large-size flexible display panels. Because the organic light-emitting materials in OLED devices will affect the light-emitting effect of the organic light-emitting materials after contacting water and oxygen, affecting the quality and service life of OLED devices, it is great important of packaging OLED devices.

SUMMARY

Embodiments of the present disclosure provide a packaging cover plate and a manufacturing method thereof, a display panel, and a display device.

According to at least one embodiment of the present disclosure, a packaging cover plate is provided, comprising, a packaging sheet comprising a first surface and a second surface opposite to each other. The first surface of the packaging sheet is provided with at least one first channel, the second surface of the packaging sheet is provided with at least one second channel, and an extension direction of the at least one first channel is parallel to an extension direction of the at least one second channel. An orthographic projection of the at least one first channel on the packaging sheet and an orthographic projection of the at least one second channel on the packaging sheet are arranged alternately, and a sum of a depth of the at least one first channel and a depth of the at least one second channel is not less than a thickness of the packaging sheet.

For example, the depth of each of the at least one first channel is not less than half of the thickness of the packaging sheet; and the depth of each of the at least one second channel is not less than half of the thickness of the packaging sheet.

For example, the depth of each of the at least one first channel is equal to the depth of each of the at least one second channel.

For example, the thickness of the packaging sheet is about 150 microns, the depth of the at least one first channel is in a range from about 90 to about 110 microns, and the depth of the at least one second channel is in a range from about 90 to about 110 microns; opening sizes of the at least one first channel and the at least one second channel satisfy at least one of the following: the opening size of each of the at least one first channel is about 150 microns; and the opening size of each of the at least one second channel is about 150 microns.

For example, the first surface of the packaging sheet is provided with at least two first channels, the second surface of the packaging sheet is provided with at least two second channels, and the at least two first channels and the at least two second channels satisfy at least one of the following: a spacing between two adjacent first channels is about 200 microns; and a spacing between two adjacent second channels is about 200 microns.

For example, longitudinal sections of the first channels and the second channels satisfy at least one of the following: the longitudinal section of the first channels is one of a rectangle, a trapezoid, a triangle and a semicircle, and the longitudinal section is substantially perpendicular to the extension direction of the first channels; and the longitudinal section of the second channels is one of a rectangle, a trapezoid, a triangle and a semicircle, and the longitudinal section is substantially perpendicular to the extension direction of the second channels.

For example, the packaging cover plate further comprises at least one of an injection molding layer or an adhesive layer; the injection molding layer is arranged on the first surface; and the adhesive layer is arranged on the second surface, and each of the second channels is filled with adhesive.

For example, the packaging sheet is rectangular, and a length of the packaging sheet is greater than a width of the packaging sheet; and the extension direction of the first channels is parallel to a width direction of the packaging sheet, and the extension direction of the second channels is parallel to the width direction of the packaging sheet.

For example, the packaging sheet is made of a metal or an alloy.

At least one embodiment also provides a display panel, comprising, a display substrate and the packaging cover plate. The display substrate comprises a base substrate, and a thin film transistor (TFT) and a light-emitting device sequentially arranged on the base substrate, and the packaging cover plate is arranged on a side of the light-emitting device away from the transparent base substrate.

For example, a setting range of the first channels and the second channels in a given direction is positively correlated with a thermal expansion coefficient of the base substrate, and the given direction is perpendicular to the extension direction of the first channels.

For example, the substrate is a transparent substrate.

At least one embodiment provides a display device, comprising, the display panel.

At least one embodiment also provides a method of manufacturing a packaging cover plate, comprising, providing a packaging sheet; forming at least one first channel on a first surface of the packaging sheet by an etching process; forming at least one second channel on a second surface of the packaging sheet by an etching process. The at least one second surface is opposite to the at least one first surface, and an extension direction of the at least one first channel is parallel to an extension direction of the at least one second channel. An orthographic projection of the at least one first channel on the packaging sheet and an orthographic projection of the at least one second channel on the packaging sheet are arranged alternately, and a sum of a depth of the at least one first channel and a depth of the at least one second channel is not less than a thickness of the packaging sheet.

For example, the packaging sheet is made of a metal or an alloy, and the method further comprises cleaning the surfaces of the packaging sheet before the surfaces are etched.

BRIEF DESCRIPTION OF THE DRAWINGS

Embodiments of the present disclosure will be described in detail hereinafter in conjunction with accompanying drawings to allow one of ordinary skill in the art to understand the present disclosure more clearly, in which.

DETAILED DESCRIPTION

Technical solutions of the embodiments will be described in a clearly and fully understandable way in connection with the drawings related to the embodiments of the present disclosure. It is apparent that the described embodiments are just a part but not all of the embodiments of the present disclosure. Based on the described embodiments herein, one of ordinary skill in the art can obtain other embodiment(s), without any creative work, which shall be within the scope of the present disclosure.

Unless otherwise defined, all the technical and scientific terms used herein have the same meanings as commonly understood by one of ordinary skill in the art to which the present invention belongs. The terms, such as "first," "second," or the like, which are used in the description and the claims of the present disclosure, are not intended to indicate any sequence, amount or importance, but for distinguishing various components. The terms, such as "comprise/comprising," "include/including," or the like are intended to specify that the elements or the objects stated before these terms encompass the elements or the objects and equivalents thereof listed after these terms, but not preclude other elements or objects. The terms, such as "connect/connecting/connected," "couple/coupling/coupled" or the like, are not limited to a physical connection or mechanical connection, but may include an electrical connection/coupling, directly or indirectly. The terms, "on," "under," "left," "right" or the like are only used to indicate relative position relationship, and when the position of the object which is described is changed, the relative position relationship may be changed accordingly.

The bottom emission type OLED device is packaged with a metallic sheet by a surface adhesive packaging way, and the packaged OLED display panel comprises: a base substrate, thin film transistor(s) and an OLED device(s) sequentially arranged on the base substrate, and an adhesive material layer and a metallic sheet arranged in layers on a side of the OLED device away from the base substrate. A glass substrate is generally used as a base substrate.

The inventors have noticed that the extents of the deformation of the metallic sheet and the glass substrate are different after the display panel is heated, because the metallic sheet and the glass substrate have different thermal expansion coefficients, which will result in the deformation of the display panel and the poor yield of the display panel.

Figure 1:
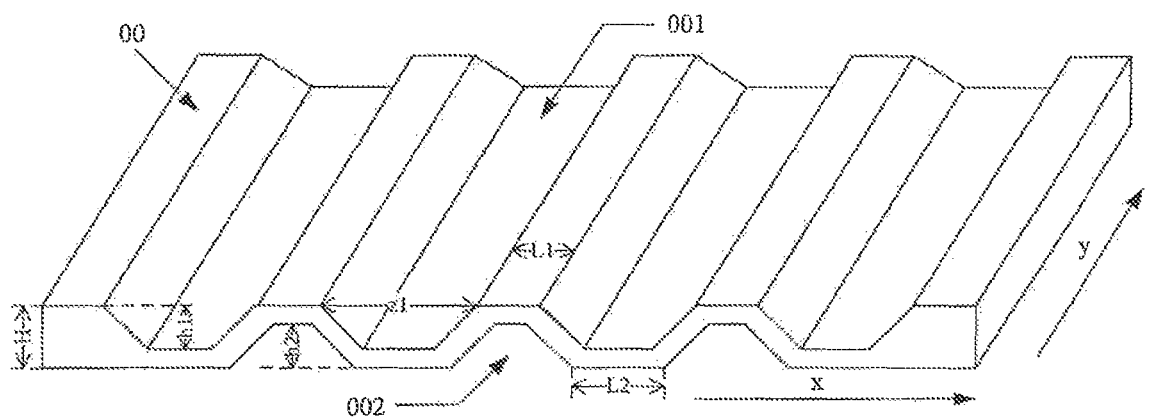
FIG. 1 is a schematically structural diagram of a packaging cover plate provided by an embodiment of the present disclosure.

FIG. 1 is a schematically structural diagram of a packaging cover plate provided by an embodiment of the present disclosure. As shown in FIG. 1, the packaging cover plate comprises a packaging sheet (e.g., a metallic sheet) 00. The packaging sheet comprises a first surface and a second surface which are opposite to each other. The first surface of the metallic sheet 00 is provided with at least one first channel 001, the second surface of the packaging sheet 00 is provided with at least one second channel 002, the second surface is opposite to the first surface, and an extension direction of the first channel 001 is parallel to an extension direction of the second channel 002. The extension directions of the first channel and/or the second channel are both y direction.

The orthographic projection of the at least one first channel 001 on the packaging sheet 00 and the orthographic projection of the at least one second channel 002 on the packaging sheet 00 are alternately arranged, and the sum of the depth h1 of the first channel 001 and the depth h2 of the second channel 002 is not less than the thickness H of the metallic sheet 00.

It is to be noted that the orthographic projection of the at least one first channel 001 on the packaging sheet 00 and the orthographic projection of the at least one second channel 002 on the packaging sheet 00 are arranged alternately, that is, no overlapping area is presented between the orthographic projection of the at least one first channel 001 on the packaging sheet 00 and the orthographic projection of the at least one second channel 002 on the packaging sheet 00. The sum of the depths of the first channel 001 and the second channel 002 is not less than the thickness of the packaging sheet, and the packaging sheet can be a folded structure with good ductility in the arrangement direction of the channels. The arrangement direction x of the channels is perpendicular to the extension direction y of the first channels and/or the second channels. The packaging sheet is, for example, a metallic sheet made of a metal and an alloy.

Although the above embodiment is described by using a metallic sheet as an example, the embodiments of the present disclosure are not limited thereto, and packaging sheets made of other materials may also be used, that is, the embodiments of the present disclosure can be applied to cases where the expansion coefficients of the packaging sheet and the substrate are different.

For example, the packaging cover plate provided by the embodiments of the present disclosure can be used for packaging a bottom emission type OLED device, and the packaging cover plate is arranged on the side of the OLED device away from the base substrate.

According to the packaging cover plate provided by the embodiments of the present disclosure, the channels are alternately arranged on two sides of the packaging sheet (e.g., a metallic sheet), so that a folded structure is formed on the metallic sheet; because the sum of the depths of the first channel and the second channel is not less than the thickness of the packaging sheet, when the display panel provided with the packaging cover plate is heated and the base substrate in the display panel is deformed, the folded structure can be extended in the arrangement direction to cope with the deformation of the base substrate, which, to some extent, decreases the bending extent of the display panel caused by different deformation extents of the packaging cover plate and the base substrate, and improves the quality of the display panel in a reliable environment.

For example, the depth of each first channel is not less than half of the thickness of the packaging sheet; and the depth of each second channel is not less than half of the thickness of the packaging sheet. Optionally, the depth of the first channel is equal to the depth of the second channel. In the embodiments of the present disclosure, the depth of the first channel and the depth of the second channel are both designed to be not less than half of the thickness of the packaging sheet; as a result, on one hand, the sum of the depth of the first channel and the depth of the second channel is not less than the thickness of the packaging sheet; in addition, when the depth of one of the first channel and the second channel is less than half of the thickness of the packaging sheet, the depth of the other channel must be greater than half of the thickness of the packaging sheet, so when the depth of the channel provided on the packaging sheet is great, the position of the channel may be broken when the packaging sheet is subjected to an external force, resulting in lower reliability of the packaging. By setting the depth of the first channel to be equal to the depth of the second channel, the reliability of the packaging sheet can be improved to some extent.

Exemplarily, when the thickness of the packaging sheet is about 150 microns, the depth of the first channel is in a range from about 90 to about 110 microns, and the depth of the second channel is in a range from about 90 to about 110 microns. The opening sizes of the first channel and the second channel satisfy at least one of the following: the opening size of each first channel is about 150 microns; and the opening size of each second channel is about 150 microns.

Figure 2:
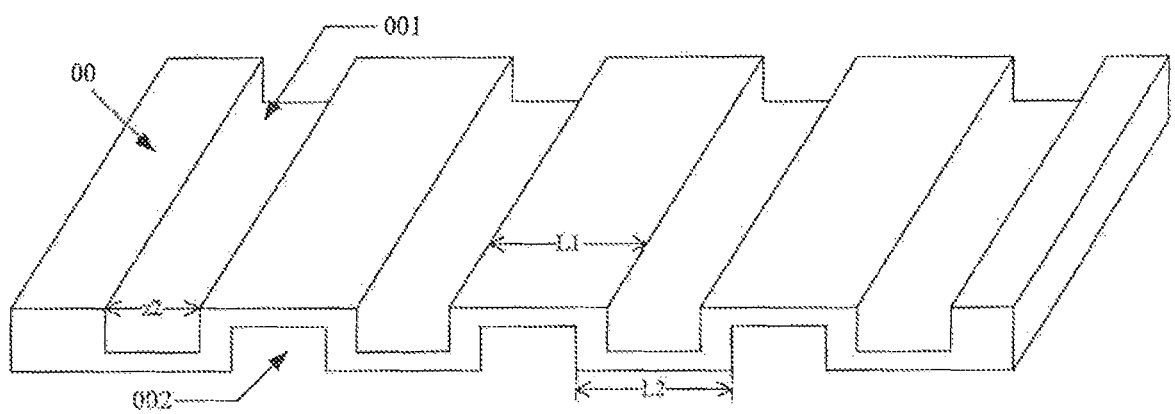
FIG. 2 is a schematically structural diagram of another packaging cover plate provided by an embodiment of the present disclosure.
Figure 3:
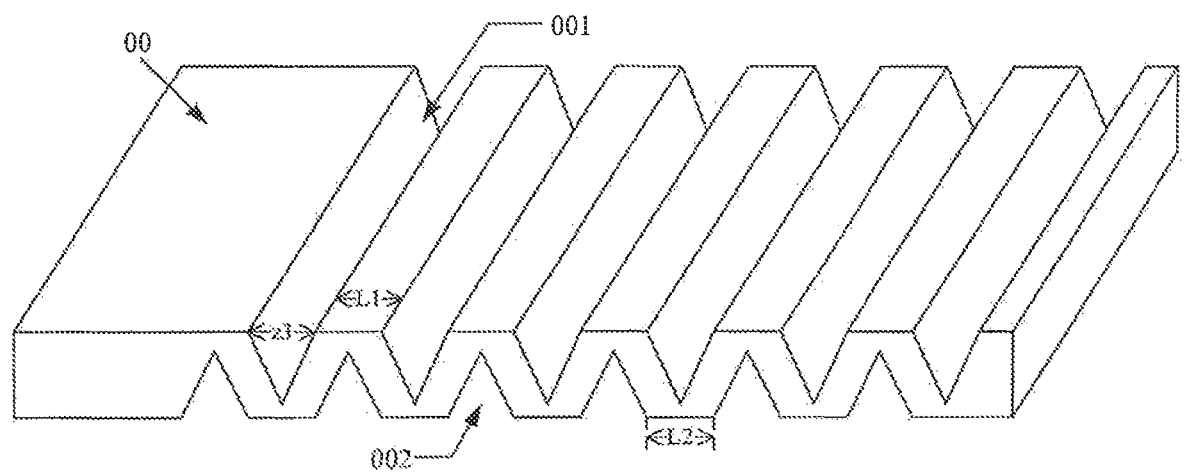
FIG. 3 is a schematically structural diagram of yet another packaging cover plate provided by an embodiment of the present disclosure.
Figure 4:
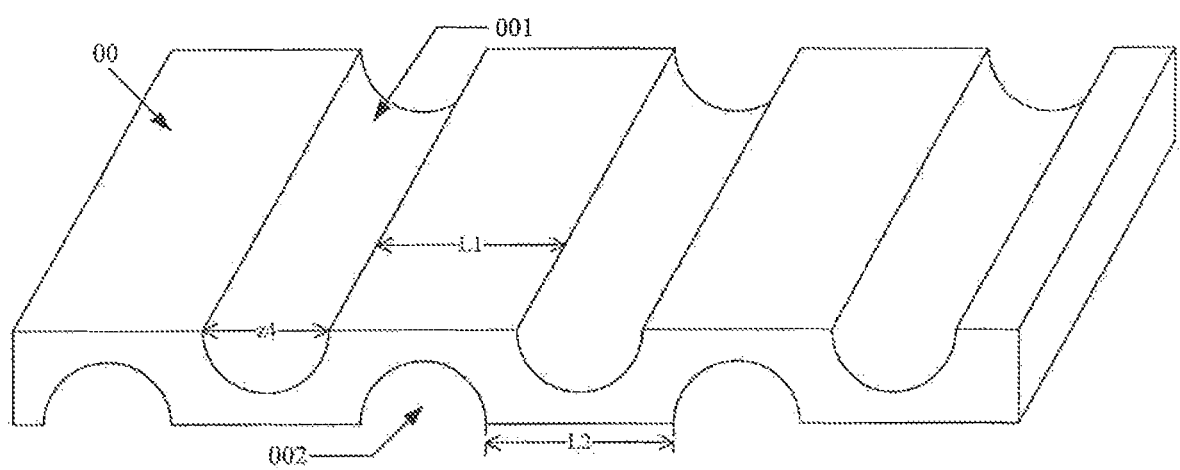
FIG. 4 is a schematically structural diagram of yet another packaging cover plate provided by an embodiment of the present disclosure.

For example, the longitudinal section of the first channel is one of a rectangle, a trapezoid, a triangle and a semicircle, and the longitudinal section is perpendicular to the extension direction of the first channel. The longitudinal section of the second channel is one of a rectangle, a trapezoid, a triangle and a semicircle, and the longitudinal section is perpendicular to the extension direction of the second channel. However, the shapes of the longitudinal sections of the first channel and the second channel of the embodiments of the present disclosure are not limited to the above embodiments. Referring to FIG. 1, when the longitudinal sections of the first channel and the second channel are trapezoidal, the above opening size is the length z1 of the bottom edge of the trapezoid. Referring to FIG. 2, when the longitudinal sections of the first channel and the second channel are rectangular, the above opening size is the side length z2 of the rectangle. Referring to FIG. 3, when the longitudinal sections of the first channel and the second channel are triangular, the above opening size is the length z3 of the bottom edge of the triangle. Referring to FIG. 4, when the longitudinal sections of the first channel and the second channel are semicircular, the above opening size is the diameter z4 of the semicircle. Referring to FIG. 1 and FIG. 2, when the longitudinal sections of the first channel and the second channel are trapezoidal or rectangular, the longitudinal section of the packaging sheet may be in a "Z" shape.

It is to be noted that the shapes of the first channel and the second channel on the packaging cover plate provided by the embodiments of the present disclosure may be the same, for example, the longitudinal sections of the first channel and the second channel are both rectangular. The shapes of the first channel and the second channel may also be different, for example, the longitudinal section of the first channel is rectangular and the longitudinal section of the second channel is trapezoidal, and the embodiments of the present disclosure are not limited thereto.

In an alternative embodiment of the present disclosure, referring to the packaging cover plate shown in any one of FIG. 1 to FIG. 4, the first surface of the packaging sheet 00 is provided with at least two first channels 001, and the second surface of the packaging sheet 00 is provided with at least two second channels 002. Exemplarily, the at least two first channels 001 and the at least two second channels 002 satisfy at least one of the following: the spacing L1 between two adjacent first channels 001 is about 200 microns; and the spacing L2 between two adjacent second channels is about 200 microns.

Figure 5:
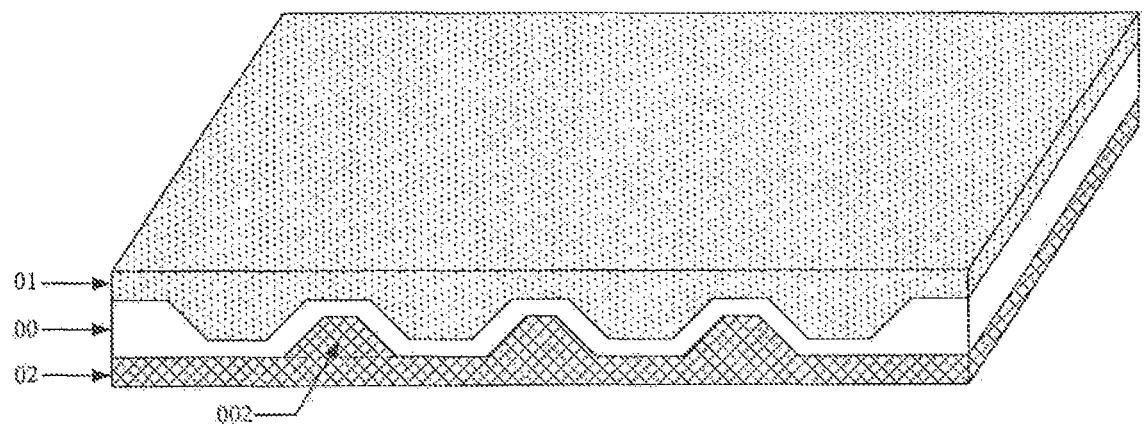
FIG. 5 is a schematically structural diagram of yet another packaging cover plate provided by an embodiment of the present disclosure.

For example, referring to FIG. 5, the packaging cover plate further comprises an injection molding layer 01 disposed on the first surface of the packaging sheet 00. It is to be noted that the injection molding layer can be used to fill the first channels and serve an anti-corrosion function so as to protect the packaging sheet (e.g., metallic sheet).

Further, for example, referring to FIG. 5, the packaging cover plate further comprises an adhesive layer 02 disposed on the second surface of the packaging sheet 00, and each second channel 002 is filled with adhesive. It is to be noted that the adhesive layer is used to fixedly connect the packaging sheet and the light-emitting device, and can also prevent water and oxygen from invading the interior of the light-emitting device, to protect the light-emitting device. The second channels are filled with the adhesive; as a result, on one hand, the fixed connection between the packaging sheet and the light-emitting device can be enhanced, and the connection firmness between the packaging sheet and the light-emitting device can be improved; in addition, because the adhesive can be elastically deformed, when the base substrate disposed on the other side of the light-emitting device is deformed, the adhesive in the second channel can absorb partial deformation, so as to reduce the extent of the deformation of the packaging sheet.

For example, when the packaging sheet is rectangular, the length of the packaging sheet is greater than the width of the packaging sheet, the extension direction of the first channel is parallel to the width direction of the packaging sheet, and the extension direction of the second channel is parallel to the width direction of the packaging sheet. It is to be noted that for a same object, the deformation extent in the length direction upon expanding with heat and contracting with coldness is usually greater than that in the width direction. By setting the extension direction of the first channel and the second channel to be parallel to the width direction of the packaging sheet, the packaging sheet can cope with the deformation of the base substrate in the length direction. For example, the extension directions of the first channel and the second channel may be set parallel to the length direction of the packaging sheet, and the embodiments of the present disclosure are not limited thereto. The packaging sheet is, for example, a metallic sheet made of a metal and an alloy.

According to the packaging cover plate provided by the embodiments of the present disclosure, the channels are alternately arranged on two sides of the packaging sheet (e.g., a metallic sheet), so that a folded structure is formed on the packaging sheet. Because the sum of the depths of the first channel and the second channel is not less than the thickness of the packaging sheet, when the display panel provided with the packaging cover plate is heated and the base substrate in the display panel is deformed, the folded structure can be extended in the arrangement direction to cope with the deformation of the base substrate, which, to some extent, reduces the bending extent of the display panel caused by different deformation extents of the packaging cover plate and the base substrate, and improves the quality of the display panel in a reliable environment. In addition, the deformation of the base substrate is coped with by the first channel and the second channel on the packaging sheet without considering the extensibility of the packaging itself, thus reducing the difficulty in selecting the packaging cover plate. The packaging sheet is, for example, a metallic sheet made of a metal and an alloy. However, the embodiments of the present disclosure are not limited to this, and other materials may be used as the packaging sheet in the packaging cover plate, that is, the embodiments of the present disclosure may be applied to cases where the expansion coefficients of the packaging sheet and the substrate are different.

Embodiments of the present disclosure provide a display panel, comprising: a display substrate and a packaging cover plate as shown in any one of FIG. 1 to FIG. 5.

Figure 6:
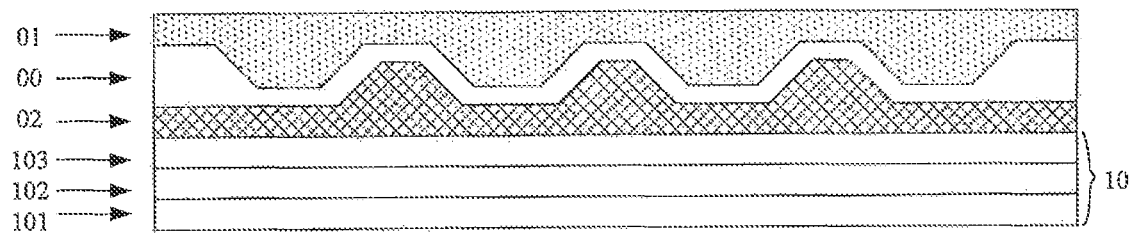
FIG. 6 is a schematically structural diagram of a display panel provided by an embodiment of the present disclosure.

Exemplarily, FIG. 6 is a schematically structural diagram of a display panel provided by an embodiment of the present disclosure. As shown in FIG. 6, the display panel comprises a display substrate 10 and the packaging cover plate as shown in FIG. 5. The display substrate 10 comprises a base substrate 101, and a transistor (TFT) layer 102 and a light-emitting device layer 103 which are sequentially disposed on the base substrate 101, the packaging cover plate being disposed on a side of the light-emitting device layer 103 away from the base substrate 101.

For example, the setting range of the first channels and the second channels in a given direction is positively correlated with the thermal expansion coefficient of the base substrate, and the given direction is perpendicular to the extension direction of the first channels. The given direction is the arrangement direction of the first channels and the second channels. The first channels and the second channels on the metal plate do not need to be arranged on the entire surface, and can be arranged according to the thermal expansion coefficient of the base substrate. For example, if the difference in deformation extents between the metal sheet and the base substrate in the length direction is 10%, the first channels and the second channels extending in the width direction can be arranged within the length range of about 10% in the length direction of the metal sheet. The amount, size, range, and the like of the first channels and the second channels provided on the metal sheet may be determined according to the deformation extent of the display substrate (e.g., transparent base substrate), but the embodiments of the present disclosure are not limited thereto.

For example, the base substrate may be made of transparent materials, such as glass, silicon chips, quartz, and plastics.

According to the display panel provided by the embodiments of the present disclosure, channels are alternately arranged on two sides of the packaging sheet (e.g., a metallic sheet) in the packaging cover plate, so that a folded structure is formed on the packaging sheet; because the sum of the depths of the first channel and the second channel is not less than the thickness of the packaging sheet, when the display panel provided with the packaging cover plate is heated and the base substrate in the display panel is deformed, the folded structure can be extended in the arrangement direction to cope with the deformation of the base substrate, which improves the bending extent of the display panel caused by different deformation extents of the packaging cover plate (e.g., a metallic packaging cover plate) and the base substrate, and improves the quality of the display panel in a reliable environment.

Although the above embodiments are described by using a metallic sheet as an example, the embodiments of the present disclosure are not limited thereto, for example, a packaging sheet made of other materials may also be used, that is, the embodiments of the present disclosure are applicable to cases where the expansion coefficients of the packaging sheet and the substrate are different.

The embodiments of the present disclosure provide a display device, comprising: the display panel as shown in FIG. 6. The display device may be a bottom emission type OLED display device.

For example, the display device can be any product or component with a display function, such as electronic paper, a cellphone, a tablet PC, a television, a display, a laptop, a digital photo frame, a navigator, or the like.

According to the display device provided by the embodiments of the present disclosure, channels are alternately arranged on two sides of the packaging sheet (e.g., a metallic sheet) in the packaging cover plate, so that a folded structure is formed on the packaging sheet; because the sum of the depths of the first channel and the second channel is not less than the thickness of the packaging sheet, when the display panel provided with the packaging cover plate is heated and the base substrate in the display panel is deformed, the folded structure can be extended in the arrangement direction to cope with the deformation of the base substrate, which improves the bending extent of the display panel caused by different deformation extents of the packaging cover plate (e.g., a metal packaging cover plate) and the base substrate, and improves the quality of the display device in a reliable environment.

Although the above embodiment is described by using a metallic sheet as an example, the embodiments of the present disclosure are not limited thereto, and packaging sheets made of other materials may also be used, that is, the embodiments of the present disclosure are applicable to cases where the expansion coefficients of the packaging sheets and the substrate are different.

Figure 7:
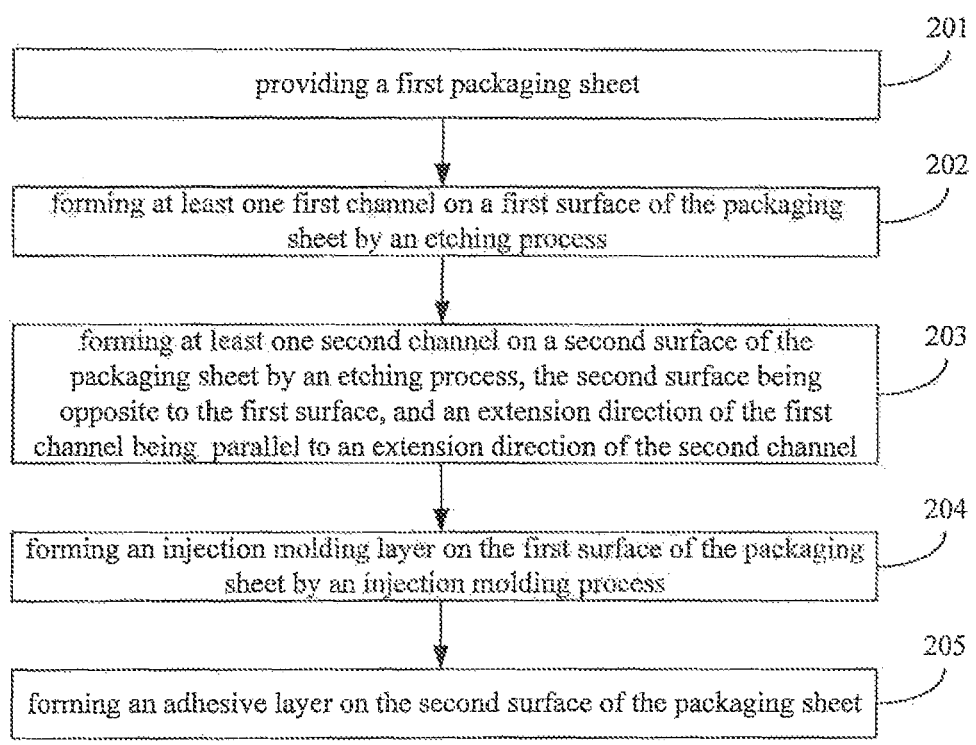
FIG. 7 is a flowchart of a method of manufacturing a packaging cover plate provided by an embodiment of the present disclosure.

FIG. 7 is a flowchart of a method of manufacturing a packaging cover plate provided by an embodiment of the present disclosure. As shown in FIG. 7, the method comprises:

S201: providing a packaging sheet.

For example, the packaging sheet provided by the embodiment of the present disclosure is made of a metal or an alloy. However, the embodiments of the present disclosure are not limited to this, and the packaging sheet may be made of other materials. The surfaces of the packaging sheet can also be cleaned by a standard cleaning process.

S202: forming at least one first channel on a first surface of the packaging sheet by an etching process.

For example, a dry etching process or a wet etching process may be used to form the at least one first channel on the first surface of the packaging sheet.

S203: forming at least one second channel on a second surface of the packaging sheet by an etching process, the second surface being opposite to the first surface, and an extension direction of the first channel being parallel to an extension direction of the second channel.

For example, a dry etching process or a wet etching process may be used to form the at least one second channel on the second surface of the packaging sheet.

The orthographic projection of the at least one first channel on the packaging sheet and the orthographic projection of the at least one second channel on the packaging sheet are arranged alternately, and the sum of the depth of the first channel and the depth of the second channel is not less than the thickness of the packaging sheet.

S204: forming an injection molding layer on a first surface of the metallic sheet by an injection molding process.

It is to be noted that the injection molding layer can be used to fill the first channels and serves an anti-corrosion function to protect the packaging sheet.

For example, after the injection molding layer is formed on the first surface of the packaging sheet, the injection molding layer is polished to smooth its surface.

S205; forming an adhesive layer on the second surface of the packaging sheet.

For example, adhesive may be coated on the second surface of the packaging sheet such that the second channels are filled with the adhesive, and an adhesive layer can be formed on the second surface of the packaging sheet. It is to be noted that the adhesive layer is used to fixedly connect the packaging sheet and the light-emitting device, and can also prevent water and oxygen from invading the interior of the light-emitting device, to protect the light-emitting device. By filling the second channels with the adhesive, on one hand, the fixed connection between the packaging sheet and the light-emitting device can be enhanced, and the connection firmness between the packaging sheet and the light-emitting device can be improved; in addition, because the adhesive can be elastically deformed, when the base substrate disposed on the other side of the light-emitting device is deformed, the adhesive in the second channels can absorb partial deformation, so that the deformation extent of the packaging sheet is decreased.

Further, for example, after the preparation of the packaging cover plate, the surface of the packaging cover plate provided with the adhesive layer is attached with the display substrate to prepare and obtain the display panel.

For example, the packaging sheet is a metallic sheet made of a metal or an alloy. However, the embodiments of the present disclosure are not limited to this, and packaging sheets made of other materials may be used, that is, the embodiments of the present disclosure are applicable to cases where the expansion coefficients of the packaging sheets and the substrate are different.

It is to be noted that the sequence of steps in the method of manufacturing the packaging cover plate provided by the embodiments of the present disclosure can be adjusted appropriately. For example, S205 can be performed before S204, and the steps can also be correspondingly added or reduced upon situations. For example, S204 may not be performed. Any way that can be easily contemplated by a person skilled in the art within the technical scope disclosed by the present disclosure shall fall within the scope of the present disclosure, and therefore will not be repeated.

According to the method of manufacturing the packaging cover plate provided by the embodiments of the present disclosure, the channels are alternately arranged on the two sides of the metallic sheet, so that a folded structure is formed on the metallic sheet; and because the sum of the depths of the first channel and the second channel is not less than the thickness of the metallic sheet, when the display panel provided with the packaging cover plate is heated and the base substrate in the display panel is deformed, the folded structure can be extended in the arrangement direction to cope with the deformation of the base substrate, which, to some extent, decreases the bending extent of the display panel caused by different deformation extents of the metal packaging cover plate and the base substrate, and improves the quality of the display panel in a reliable environment.

The structure and function of the packaging cover plate in the above method embodiments have been described in detail in the embodiments about the structure of the packaging cover plate, and will not be described in detail herein.

The above description is only exemplary embodiments of the present disclosure and is not intended to limit the present disclosure. Any modification, equivalent substitution, improvement, and the like made within the principles of the present disclosure shall fall within the scope of the present disclosure.

What is claimed is:

1. A packaging cover plate, comprising,
a packaging sheet comprising a first surface and a second surface opposite to each other, wherein the first surface of the packaging sheet is provided with at least one first channel, the second surface of the packaging sheet is provided with at least one second channel, and an extension direction of the at least one first channel is parallel to an extension direction of the at least one second channel;
wherein an orthographic projection of the at least one first channel on the packaging sheet and an orthographic projection of the at least one second channel on the packaging sheet are arranged alternately, and a sum of a depth of the at least one first channel and a depth of the at least one second channel is not less than a thickness of the packaging sheet;
wherein the depth of each of the at least one first channel is equal to the depth of each of the at least one second channel;
a first cross section of each of the first channels in a direction perpendicular to the extension direction of the first channels is one of a trapezoid, a triangle, and a semicircle, and a second cross section of each of the second channels in a direction perpendicular to the extension direction of the second channels is one of a trapezoid, a triangle, and a semicircle;
the thickness of the packaging sheet is about 150 microns, the depth of the at least one first channel is in a range from about 90 to about 110 microns, and the depth of the at least one second channel is in a range from about 90 to about 110 microns;
opening sizes of the at least one first channel and the at least one second channel satisfy at least one of the following:
the opening size of each of the at least one first channel is about 150 microns; and
the opening size of each of the at least one second channel is about 150 microns.

2. The packaging cover plate according to claim 1, wherein the first surface of the packaging sheet is provided with at least two first channels, the second surface of the packaging sheet is provided with at least two second channels, and the at least two first channels and the at least two second channels satisfy at least one of the following:
a spacing between two adjacent first channels is about 200 microns; and a spacing between two adjacent second channels is about 200 microns.

3. The packaging cover plate according to claim 1, wherein the packaging cover plate further comprises at least one of an injection molding layer or an adhesive layer;
the injection molding layer is arranged on the first surface; and
the adhesive layer is arranged on the second surface, and each of the at least one second channel is filled with an adhesive.

4. The packaging cover plate according to claim 1, wherein the packaging sheet is rectangular, and a length of the packaging sheet is greater than a width of the packaging sheet; and
the extension direction of the at least one first channel is parallel to a width direction of the packaging sheet, and the extension direction of the at least one second channel is parallel to the width direction of the packaging sheet.

5. The packaging cover plate according to claim 1, wherein the packaging sheet is made of metal or an alloy.

6. The packaging cover plate according to claim 1, wherein the packaging cover plate further comprises at least one of an injection molding layer or an adhesive layer;
the injection molding layer is arranged on the first surface; and
the adhesive layer is arranged on the second surface, and each of the second channels is filled with adhesive.

7. The packaging cover plate according to claim 6, wherein the packaging sheet is rectangular, and a length of the packaging sheet is greater than a width of the packaging sheet; and
the extension direction of the first channels is parallel to a width direction of the packaging sheet, and the extension direction of the second channels is parallel to the width direction of the packaging sheet.

8. The packaging cover plate according to claim 7, wherein the packaging sheet is made of metal or an alloy.

9. The packaging cover plate according to claim 1, wherein the orthographic projection of the at least one first channel on the packaging sheet and the orthographic projection of the at least one second channel on the packaging sheet are partly overlapped with each other.

10. A display panel, comprising,
a display substrate and a packaging cover plate, wherein the packaging cover plate comprises:
a packaging sheet comprising a first surface and a second surface opposite to each other, wherein the first surface of the packaging sheet is provided with at least one first channel, the second surface of the packaging sheet is provided with at least one second channel, and an extension direction of the at least one first channel is parallel to an extension direction of the at least one second channel;
an orthographic projection of the at least one first channel on the packaging sheet and an orthographic projection of the at least one second channel on the packaging sheet are arranged alternately, and a sum of a depth of the at least one first channel and a depth of the at least one second channel is not less than a thickness of the packaging sheet;
the depth of each of the at least one first channel is equal to the depth of each of the at least one second channel;
a first cross section of each of the first channels in a direction perpendicular to the extension direction of the first channels is one of a trapezoid, a triangle, and a semicircle, and a second cross section of each of the second channels in a direction perpendicular to the extension direction of the second channels is one of a trapezoid, a triangle, and a semicircle;
the thickness of the packaging sheet is about 150 microns, the depth of the at least one first channel is in a range from about 90 to about 110 microns, and the depth of the at least one second channel is in a range from about 90 to about 110 microns;
opening sizes of the at least one first channel and the at least one second channel satisfy at least one of the following:
the opening size of each of the at least one first channel is about 150 microns; and
the opening size of each of the at least one second channel is about 150 microns
wherein the display substrate comprises a base substrate, and a thin film transistor (TFT) and a light-emitting device sequentially arranged on the base substrate, and the packaging cover plate is arranged on a side of the light-emitting device away from the base substrate.

11. The display panel according to claim 10, wherein
a setting range of the at least one first channel and the at least one second channel in a given direction is positively correlated with a thermal expansion coefficient of the base substrate, and the given direction is perpendicular to the extension direction of the first channels.

12. The display panel according to claim 11, wherein the base substrate is a transparent base substrate.

13. The display panel according to claim 10, wherein the base substrate is a transparent base substrate.

14. A display device, comprising,
the display panel according to claim 10.

15. A method of manufacturing a packaging cover plate, comprising,
providing a packaging sheet;
forming at least one first channel on a first surface of the packaging sheet by an etching process;
forming at least one second channel on a second surface of the packaging sheet by an etching process, wherein the second surface is opposite to the first surface, and an extension direction of the at least one first channel is parallel to an extension direction of the at least one second channel;
wherein an orthographic projection of the at least one first channel on the packaging sheet and an orthographic projection of the at least one second channel on the packaging sheet are arranged alternately, and a sum of a depth of the at least one first channel and a depth of the at least one second channel is not less than a thickness of the packaging sheet;
a first cross section of each of the first channels in a direction perpendicular to the extension direction of the first channels is one of a trapezoid, a triangle, and a semicircle, and a second cross section of each of the second channels in a direction perpendicular to the extension direction of the second channels is one of a trapezoid, a triangle, and a semicircle;
the thickness of the packaging sheet is about 150 microns, the depth of the at least one first channel is in a range from about 90 to about 110 microns, and the depth of the at least one second channel is in a range from about 90 to about 110 microns;
opening sizes of the at least one first channel and the at least one second channel satisfy at least one of the following:
the opening size of each of the at least one first channel is about 150 microns; and the opening size of each of the at least one second channel is about 150 microns.

16. The method according to claim 15, wherein the packaging sheet is made of metal or an alloy, and the method further comprises cleaning the surfaces of the packaging sheet before the surfaces are etched.

* * * * *